(12) United States Patent
Yang et al.

(10) Patent No.: US 10,656,027 B2
(45) Date of Patent: May 19, 2020

(54) ELECTRONIC DEVICE AND OVER-TEMPERATURE DETECTING METHOD

(71) Applicant: DELTA ELECTRONICS, INC., Taoyuan (TW)

(72) Inventors: Shang-Feng Yang, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/001,148

(22) Filed: Jun. 6, 2018

(65) Prior Publication Data

US 2019/0120702 A1  Apr. 25, 2019

(30) Foreign Application Priority Data

Oct. 23, 2017 (TW) ............................. 106136308 A (51) Int. Cl.
| | |
|---|---|
| H05K 1/00 | (2006.01) |
| G01K 7/25 | (2006.01) |
| G01K 1/02 | (2006.01) |
| H05K 1/02 | (2006.01) |
| G01K 3/00 | (2006.01) |
| G01K 7/24 | (2006.01) |

(52) U.S. Cl.
CPC ............... *G01K 7/25* (2013.01); *G01K 1/026* (2013.01); *G01K 3/005* (2013.01); *G01K 7/24* (2013.01); *H05K 1/0203* (2013.01); *H05K 2201/10151* (2013.01)

(58) Field of Classification Search
USPC ......................................................... 361/748
See application file for complete search history.

(56) References Cited

U.S. PATENT DOCUMENTS

| | | | |
|---|---|---|---|
| 2015/0228367 A1 | 1/2015 | Frei et al. | |
| 2017/0248455 A1* | 8/2017 | Miki ........................ | G01F 1/684 |
| 2017/0344033 A1* | 11/2017 | Samburg .................. | E03F 7/00 |

FOREIGN PATENT DOCUMENTS

| | | |
|---|---|---|
| CN | 101594108 | 12/2009 |
| CN | 102792513 | 11/2012 |
| TW | 200903939 | 1/2009 |
| TW | 201345129 | 11/2013 |

* cited by examiner

*Primary Examiner* — Andargie M Aychillhum
(74) *Attorney, Agent, or Firm* — Hauptman Ham, LLP (57) ABSTRACT

An electronic device includes a printed circuit board (PCB), a control circuit, and a sensing circuit. The control circuit is configured to determine whether over temperature occurs at one or more detecting points arranged at a first surface of the printed circuit board according to at least one voltage signal. The sensing circuit is arranged at a second surface opposite to the first surface of the printed circuit board and configured to sense the temperature of the one or more detecting points and correspondingly output the voltage signal to the control circuit.

9 Claims, 7 Drawing Sheets

ELECTRONIC DEVICE AND OVER-TEMPERATURE DETECTING METHOD

RELATED APPLICATIONS

This application claims priority to Taiwan Application Serial Number 106136308, filed Oct. 23, 2017, which is herein incorporated by reference.

BACKGROUND

Technical Field

The present disclosure relates to an over temperature detecting method, and in particular, to the over temperature detecting method used in an electronic device.

Description of Related Art

Conducting wires and lock attachment elements are commonly used in installing or producing various mechatronics products, in order to connect an external power source or an internal electrical terminal.

However, if the conducting wires and the lock attachment elements are not tightly connected, when the machine is running, high temperature may occur at the connecting point, which results damage to the machine or even causes a fire hazard.

SUMMARY

One aspect of the present disclosure is an electronic device. The electronic device includes a printed circuit board, a control circuit configured to determine whether over temperature occurs at one or more detecting points arranged at a first surface of the printed circuit board according to at least one voltage signal, and a sensing circuit arranged at a second surface opposite to the first surface of the printed circuit board, and configured to sense a temperature of the one or more detecting points and correspondingly output the voltage signal to the control circuit.

Another aspect of the present disclosure is an over temperature detecting method including: sensing, by a sensing circuit, a temperature of one or more detecting points; outputting, by the sensing circuit, at least one voltage signal correspondingly according to the temperature of the one or more detecting points; and determining, by a control circuit, whether over temperature occurs at the one or more detecting points according to the at least one voltage signal, in which the one or more detecting points are arranged at a first surface of a printed circuit board, and the sensing circuit is arranged at a second surface opposite to the first surface of the printed circuit board.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows:

FIG. 10 is a side view diagram illustrating the electronic device according to some other embodiments of the present disclosure.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1A:
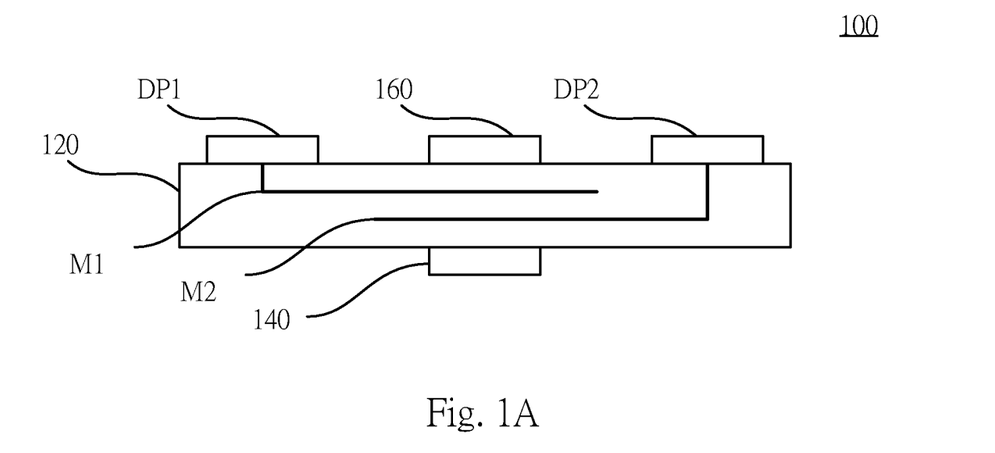
FIG. 1A is a side view diagram illustrating an electronic device according to some embodiments of the present disclosure.

Reference is made to FIG. 1A. FIG. 1A is a side view diagram illustrating an electronic device 100 according to some embodiments of the present disclosure. As shown in FIG. 1A, in some embodiments, the electronic device 100 includes a printed circuit board 120, a sensing circuit 140 and a control circuit 160. In some embodiments, the control circuit 160 may be arranged on the printed circuit board 120. In some other embodiments, the control circuit 160 and the sensing circuit 140 may be arranged on different printed circuit boards. Alternatively stated, the control circuit 160 may be arranged independent to the printed circuit board 120.

As in the embodiments shown in FIG. 1A, the control circuit 160 is arranged on the printed circuit board 120. The sensing circuit 140 and the control circuit 160 are arranged on different sides of the printed circuit board 120. For example, in some embodiments, the control circuit 160 is arranged at a first surface (e.g., the front surface) of the printed circuit board 120. The sensing circuit 140 is arranged at a second surface (e.g., the back surface) opposite to the first surface of the printed circuit board 120.

As shown in the drawing, in some embodiments, the first surface of the printed circuit board 120 includes one or more detecting points DP1, DP2. For example, the detecting points DP1 and DP2 may be connecting points applying connecting wires and lock attachment elements, such as a screw, for connecting an external power source or an internal terminal. If the connecting wires and the lock attachment elements are not tightly connected due to human errors or other reasons, an abnormal high temperature may be resulted at the detecting points DP1 and DP2, and further results in damage of the machine or even causes a fire hazard.

In order to prevent the situation stated above, in some embodiments, the electronic devices 100 may, by the sensing circuit 140 arranged at the opposite side of the detecting points DP1, DP2, sense a temperature of the detecting points DP1, DP2, and determine whether over temperature occurs at the detecting points DP1, DP2 in accompanying with operations of the control circuit 160.

In addition, as shown in the drawing, metal material, such as one or more conducting layers M1, M2 made of copper foil, is included internal to the printed circuit board 120. The printed circuit board 120 may be configured to transfer heat via the metal material of conducting layers M1, M2, such that the sensing circuit 140 senses the temperature of the detecting points DP1, DP2 arranged at the opposite surface.

Compared to the condition that heat is transmitted via the air when the sensing circuit 140 and the detecting points DP1, DP2 are arranged at the same side, in the embodiments of the present disclosure, since the sensing circuit 140 and the detecting points DP1, DP2 are arranged at the opposite side of the printed circuit board 120, heat may be transferred via the printed circuit board 120 and the metal material internal to the printed circuit board 120, which provides a higher heat transmission efficiency and improves the efficiency and accuracy of the temperature detection.

Figure 1B:
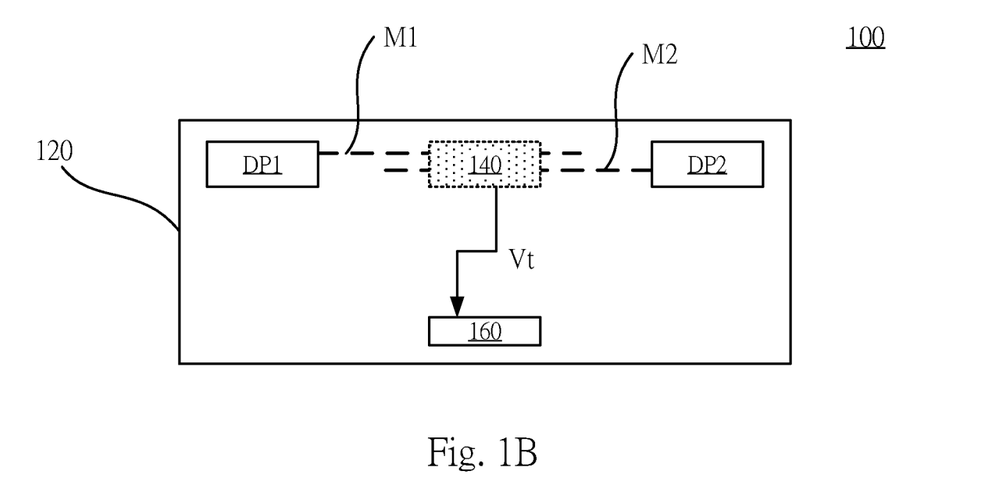
FIG. 1B is a top view diagram illustrating the electronic device corresponding to the embodiments shown in FIG. 1A.

Reference is made to FIG. 1B. FIG. 1B is a top view diagram illustrating the electronic device 100 corresponding to the embodiments shown in FIG. 1A according to some embodiments of the present disclosure. As shown in FIG. 1B, the sensing circuit 140 arranged at the back side of the printed circuit board 120 is depicted in dotted line.

Since the sensing circuit 140 is arranged at the back side of the printed circuit board 120 and does not affect the circuit layout and the arrangement of the elements at the front side, higher arrangement flexibility is obtained. Thus, the sensing circuit 140 may be configured to improve the accuracy of the temperature detection.

As shown in the drawing, in some embodiments, the sensing circuit 140 senses the temperature of the detecting points DP1, DP2 and correspondingly outputs the voltage signal Vt to the control circuit 160. Therefore, the control circuit 160 may be configured to determine whether over temperature occurs at the detecting points DP1, DP2 arranged at the first surface of the printed circuit board 120 according to the voltage signal Vt.

Specifically, the control circuit 160 may be implemented by various ways such as a Digital Signal Processor (DSP), a Microcontroller Unit (MCU), a Complex Programmable Logic Device (CPLD), or a Field-Programmable Gate Array (FPGA).

Figure 1C:
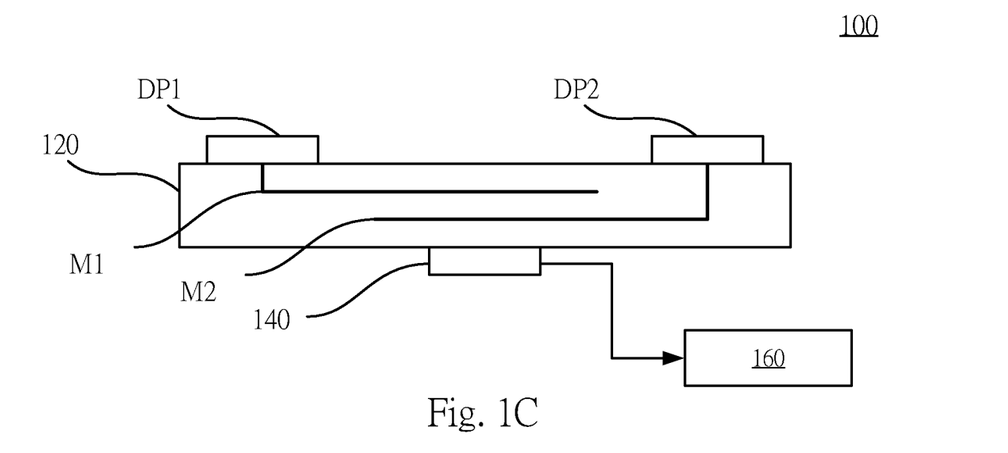
Figure 1D:
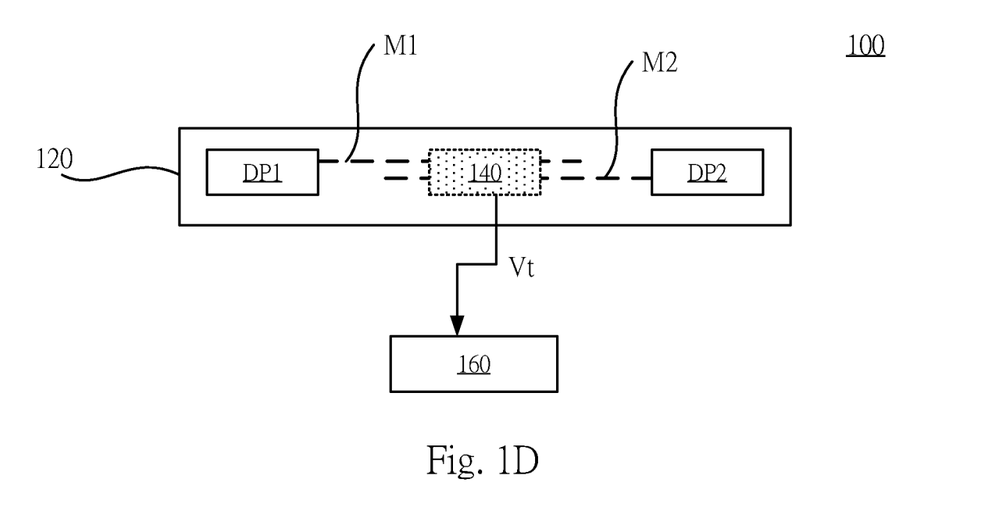
FIG. 1D is a top view diagram illustrating the electronic device corresponding to the embodiments shown in FIG. 10.

Reference is made to FIG. 1C and FIG. 1D. FIG. 1C is a side view diagram illustrating the electronic device 100 according to some other embodiments of the present disclosure. FIG. 1D is a top view diagram illustrating the electronic device 100 corresponding to the embodiments shown in FIG. 1C. In the embodiments shown in FIG. 1C and FIG. 1D, the control circuit 160 is arranged at another printed circuit board different to the sensing circuit 140 and the detecting points DP1, DP2.

In the present embodiments, the control circuit 160 may also be configured to determine whether over temperature occurs at one or more detecting points DP1, DP2 arranged at the first surface of the printed circuit board 120. The specific detailed operation is similar to the operation of the electronic device 100 shown in FIG. 1A and FIG. 1B, and thus further explanation is omitted for the sake of brevity.

Figure 2A:
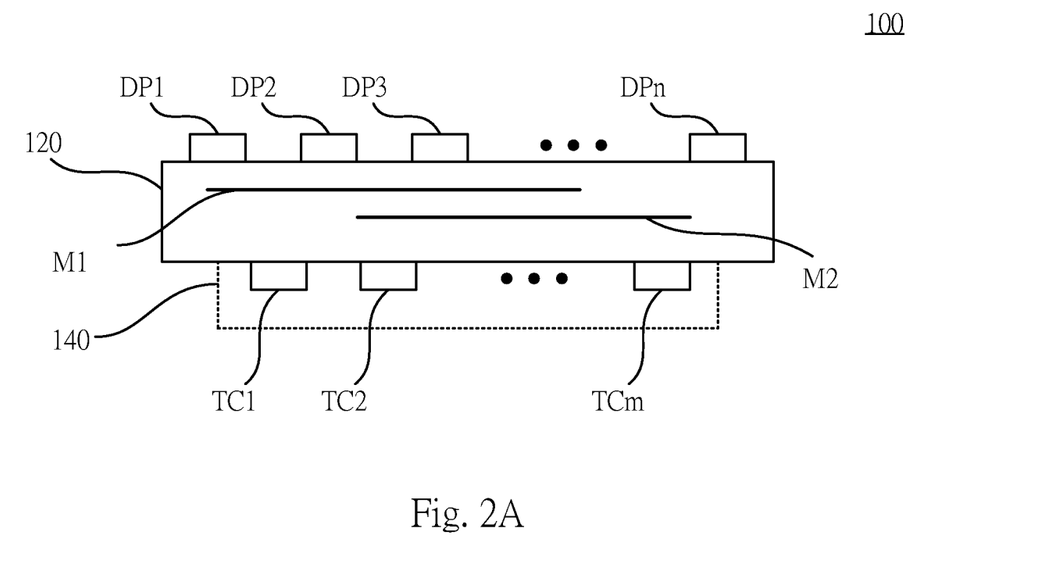
FIG. 2A is a side view diagram illustrating the electronic device according to some embodiments of the present disclosure.

In the following paragraphs, the circuit of the sensing circuit 140 and detailed operation of detecting temperature will be further discussed in accompanying with the drawings. Reference is made to FIG. 2A. FIG. 2A is a side view diagram illustrating the electronic device 100 according to some embodiments of the present disclosure. In FIG. 2A, like elements related to the embodiments of FIG. 1A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2A.

As shown in the drawing, in some embodiments, the sensing circuit 140 may, by M sensing elements TC1, TC2-TCm, detect N detecting points DP1, DP2, DP3-DPn arranged at the first surface of the printed circuit board 120. It is noted that the numbers of the sensing elements TC1, TC2-TCm, and detecting points DP1, DP2, DP3-DPn are merely example and not meant to limit the present disclosure. For example, in some other embodiments, the electronic device 100 may also include only one detecting point DP1, and the sensing circuit 140 may also include only one sensing element TC1.

As shown in FIG. 2A, any one of the sensing elements TC1, TC2-TCm may be arranged between the projection of the two adjacent detecting points DP1, DP2, DP3-DPn at the back side of the printed circuit board 120. Thus, the amount of the sensing elements TC1, TC2-TCm in the sensing circuit 140 may be less than the amounts of the detecting points DP1, DP2, DP3-DPn being detected. Accordingly, more detecting points may be detected by less sensing elements, and thus the hardware cost and the design difficulties of the sensing circuit 140 may be lowered. In the embodiments shown in FIG. 2A, since one set of sensing elements TC1, TC2-TCm is arranged between each of two adjacent detecting points DP1, DP2, DP3-DPn, the amount of the sensing elements TC1, TC2-TCm M is equal to N−1. Alternatively stated, in some embodiments, M is an integer and N is an integer larger than M.

Figure 2B:
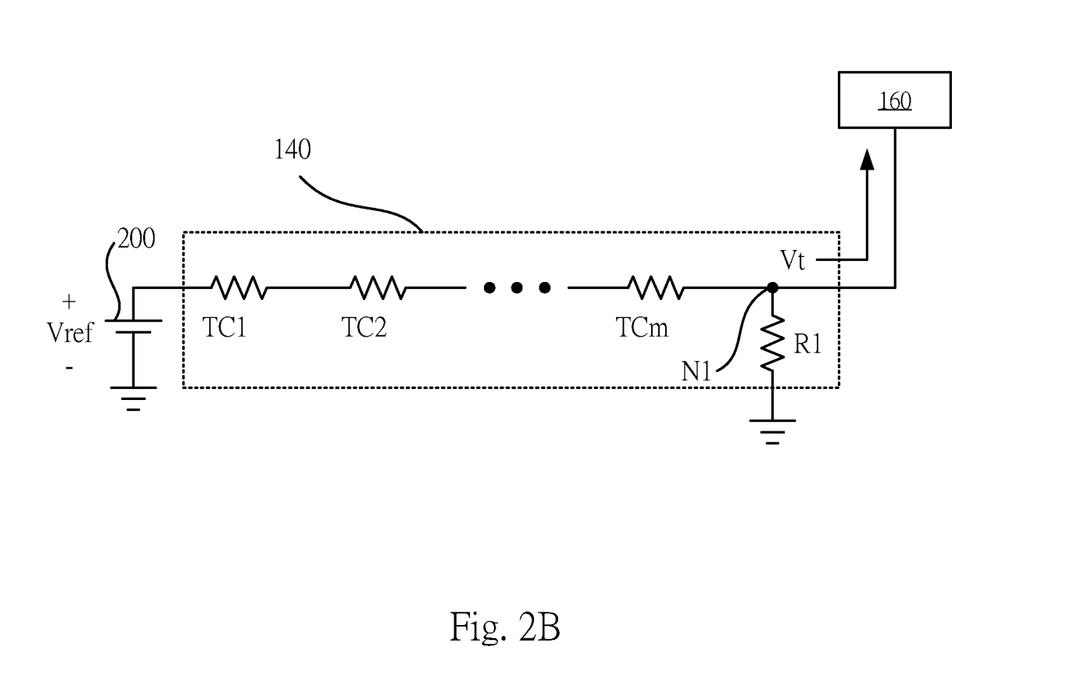
FIG. 2B is circuit diagram illustrating the sensing circuit corresponding to the embodiments shown in FIG. 2A.

Reference is made to FIG. 2B. FIG. 2B is circuit diagram illustrating the sensing circuit 140 corresponding to the embodiments shown in FIG. 2A. In FIG. 2B, like elements related to the embodiments of FIG. 2A are designated with the same reference numbers for ease of understanding.

As shown in FIG. 2B, in some embodiments, the sensing circuit 140 includes a voltage dividing resistor R1 and one or more sensing elements TC1, TC2-TCm stated in the above paragraph. The sensing elements TC1, TC2-TCm are electrically coupled to the voltage dividing resistor R1 in series. The sensing circuit 140 is electrically coupled between the voltage source 200 and a ground terminal to receive a reference voltage Vref and divide the reference voltage Vref to output the at least one voltage signal Vt to the control circuit 160 by the sensing elements TC1, TC2-TCm and the voltage dividing resistor R1.

Specifically, the sensing elements TC1, TC2-TCm are configured to sense the temperature of the detecting points DP1, DP2, DP3-DPn arranged at the first surface of the printed circuit board 120 by heat transfer via the metal material of the conducting layer M1, M2 internal to the printed circuit board 120.

In some embodiments, the sensing elements TC1, TC2-TCm may be achieved by Negative Temperature Coefficient (NTC) thermistors. Accordingly, resistance of the sensing elements TC1, TC2-TCm varies as the sensed temperature varies.

For example, on the condition that the temperature of the detecting point DP2 is abnormal, the resistance values of the adjacent sensing elements TC1, TC2 are reduced while the temperature of the detecting point DP2 rises. Therefore, the overall resistance value of the sensing elements TC1, TC2-TCm coupled in series is also reduced. At this condition, the voltage level of the node N1 rises correspondingly and thus the voltage signal Vt with a higher level is outputted to the control circuit 160. Therefore, the control circuit 160 may determine whether over temperature occurs to the electronic device 100 according to the voltage level of the voltage signal Vt, and perform corresponding protecting operation.

Specifically, in some embodiments, the control circuit 160 may be configured to determine that the over temperature occurs at the detecting points DP1, DP2, DP3-DPn, and output an over temperature warning signal on the condition that the voltage signal Vt is greater than a threshold value.

It is noted that, in some other embodiments, the sensing elements TC1, TC2-TCm may also be implemented by a Positive Temperature Coefficient (PTC) thermistors. Similarly, the overall resistance value of the sensing elements TC1, TC2-TCm coupled in series may vary as the temperature of the detecting points DP1, DP2, DP3-DPn varies, and thus output the voltage signal Vt with the corresponding level to the control circuit 160. Alternatively stated, no matter PTC thermistors, NTC thermistors, or other electronic devices with the resistance varying according to the temperature are applied to the sensing elements TC1, TC2-TCm, the control circuit 160 may determine whether over temperature occurs according to the variation of the voltage signal Vt.

Figure 3A:
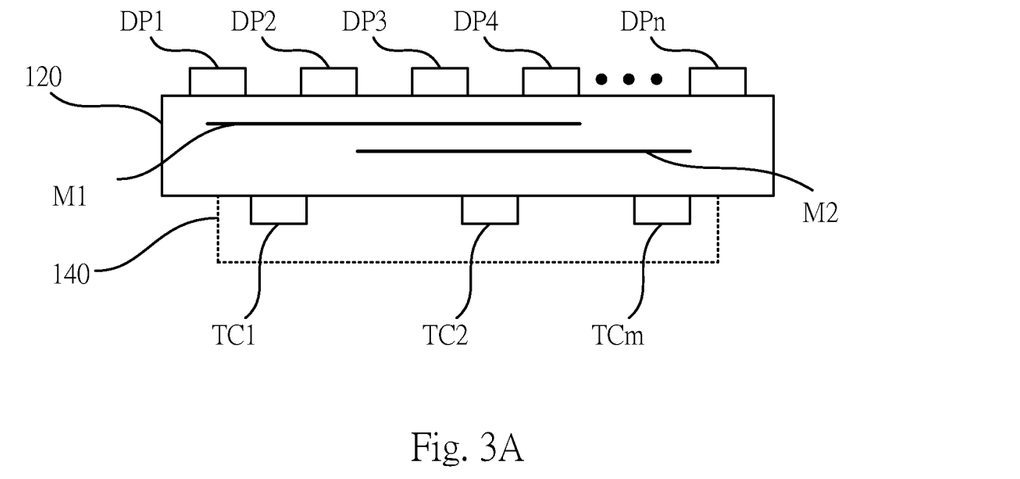
FIG. 3A is a side view diagram illustrating the electronic device according to some other embodiments of the present disclosure.

In addition, in other embodiments, the sensing elements TC1, TC2-TCm may apply various configurations to detect the temperature of the detecting points DP1, DP2, DP3-DPn. Reference is made to FIG. 3A. FIG. 3A is a side view diagram illustrating the electronic device 100 according to some other embodiments of the present disclosure. In FIG. 3A, like elements related to the embodiments of FIG. 1A and FIG. 2A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 1A and FIG. 2A.

Compared to the embodiments shown in FIG. 2A, in the embodiments shown in FIG. 3A, each of the sensing elements TC1, TC2-TCm is configured to detect two or more detecting points DP1, DP2, DP3, DP4-DPn. For example, the sensing elements TC1 may be arranged between the projection of the two adjacent detecting points DP1, DP2 at the back side of the printed circuit board 120, the sensing elements TC2 may be arranged between the projection of the two adjacent detecting points DP3, DP4 at the back side of the printed circuit board 120, and so on.

Similar to the electronic device 100 shown in FIG. 2A, in the embodiments shown in FIG. 3, the amounts of the sensing elements TC1, TC2-TCm is also less than the amounts of the detecting points DP1, DP2, DP3-DPn being detected. Accordingly, more detecting points may be detected by less sensing elements, and thus the hardware cost and the design difficulties of the sensing circuit 140 may be lowered. In the embodiments of FIG. 3A, since each of the sensing elements TC1, TC2-TCm may independently detect two adjacent detecting points DP1, DP2, DP3-DPn, the number M of the sensing elements TC1, TC2-TCm is an integer between (N/2)−1 and (N/2)+1.

Figure 3B:
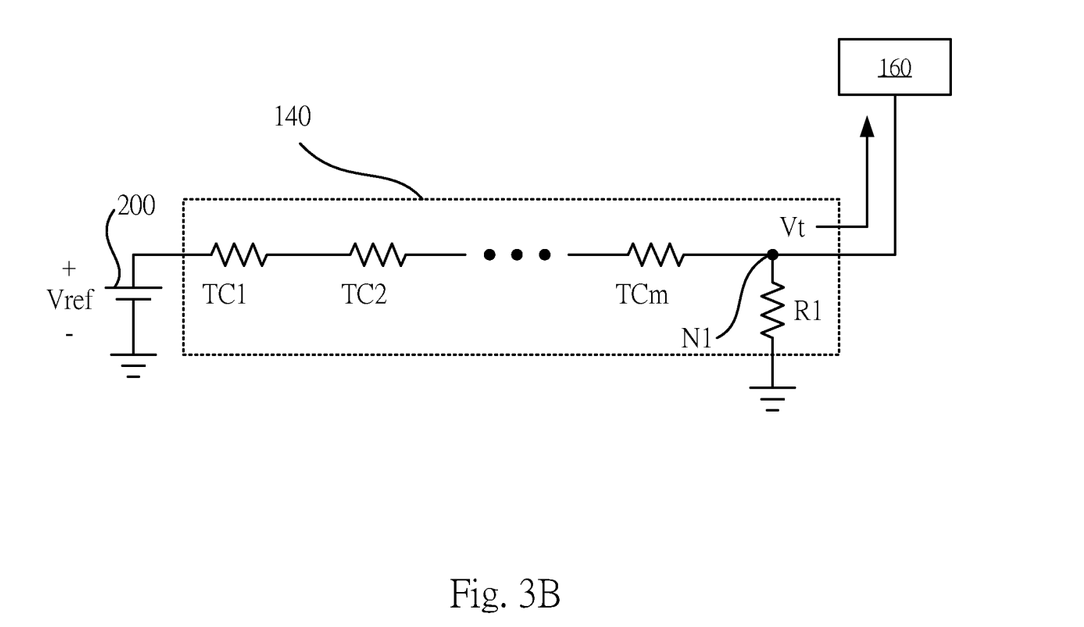
FIG. 3B is a circuit diagram of the sensing circuit corresponding to the embodiments of FIG. 3A.

Reference is made to FIG. 3B. FIG. 3B is a circuit diagram of the sensing circuit 140 corresponding to the embodiments of FIG. 3A. In FIG. 3B, like elements related to the embodiments of FIG. 3A are designated with the same reference numbers for ease of understanding.

Similar to the embodiments of FIG. 2B, in the embodiments of FIG. 3B, the sensing circuit 140 includes the voltage dividing resistor R1 and one or more sensing elements TC1, TC2-TCm stated in the above paragraph. The sensing elements TC1, TC2-TCm are electrically coupled to the voltage dividing resistor R1 in series. The sensing circuit 140 is electrically coupled between the voltage source 200 and the ground terminal to receive the reference voltage Vref and divide the reference voltage Vref to output the at least one voltage signal Vt to the control circuit 160 by the sensing elements TC1, TC2-TCm and the voltage dividing resistor R1. The specific operations are explained in detail in the above paragraphs and thus further explanations are omitted herein.

Figure 4:
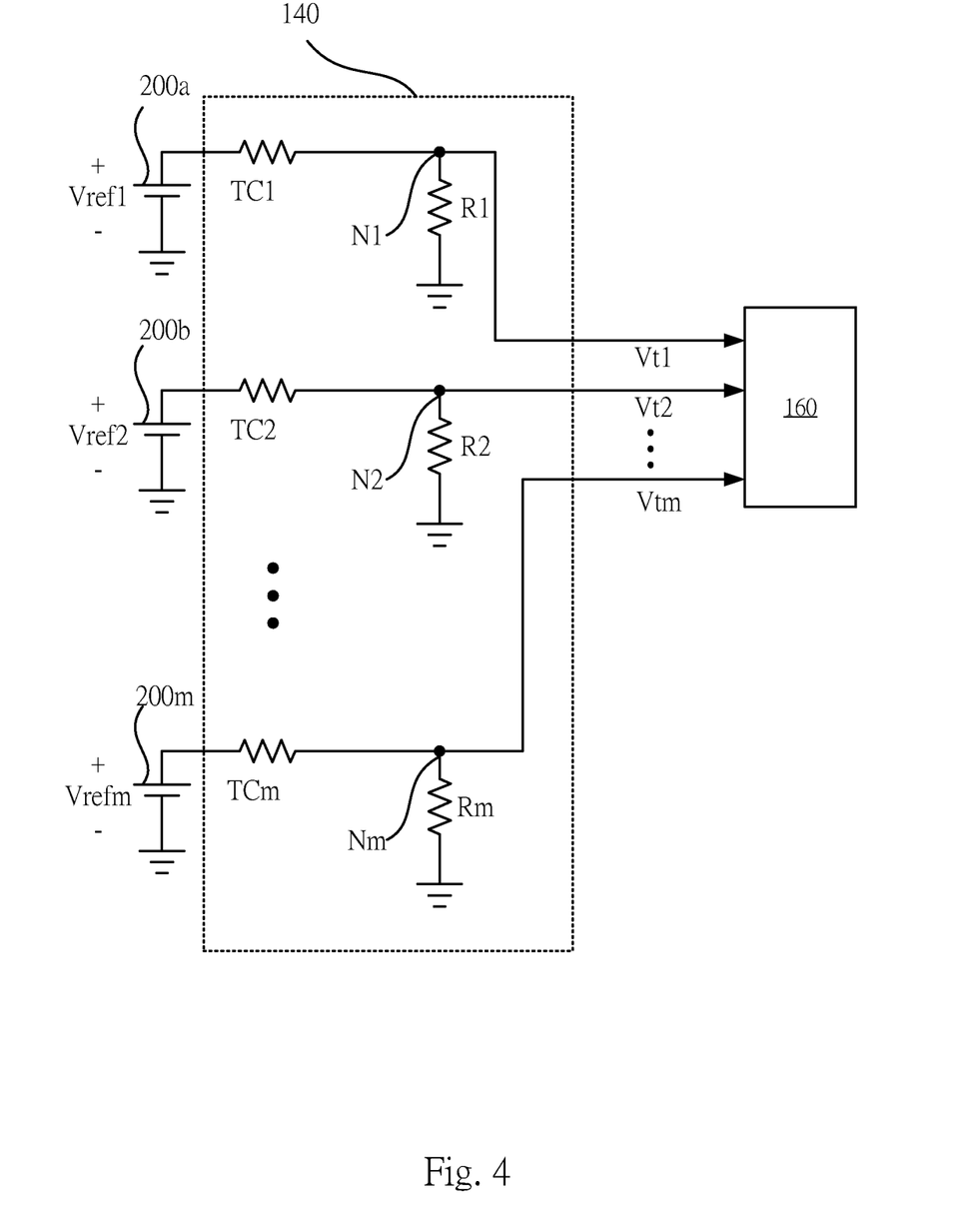
FIG. 4 is a circuit diagram illustrating the sensing circuit according to some other embodiments of the present disclosure.

In addition, in some other embodiments, the sensing circuit 140 may also be realized by various circuit structures. Reference is made to FIG. 4. FIG. 4 is a circuit diagram illustrating the sensing circuit 140 according to some other embodiments of the present disclosure. The sensing circuit 140 illustrated in FIG. 4 may be applied and used in the electronic device 100 in the embodiments of FIG. 1A, FIG. 2A, or FIG. 3A.

Compared to the embodiments shown in FIG. 2B and FIG. 3B, in the present embodiments, the sensing circuit 140 includes multiple voltage dividing resistors R1-Rm and multiple sensing elements TC1, TC2-TCm. The sensing elements TC1, TC2-TCm are electrically coupled between multiple corresponding voltage sources 200a, 200b-200m and the ground respectively to receive multiple reference voltages Vref1, Vref2-Vrefm respectively, and electrically coupled to the corresponding voltage dividing resistors R1, R2-Rm, in order to divide the reference voltages Vref1, Vref2-Vrefm by the sensing elements TC1, TC2-TCm and the voltage dividing resistors R1, R2-Rm, to output corresponding voltage signals Vt1, Vt2-Vtm to the control circuit 160 via corresponding nodes N1, N2-Nm respectively.

In the present disclosure, M sensing elements TC1, TC2-TCm of the sensing circuit 140 may also be configured to detect N detecting points DP1, DP2, DP3-DPn at the first surface of the printed circuit board 120, in which M is an integer, and N is an integer greater than M. The operation of sensing elements TC1, TC2-TCm outputting voltage signals Vt1, Vt2-Vtm with the corresponding level by varying resistances according to the temperature has been discussed in detail in the above paragraphs, and thus further explanations are omitted herein for the sake of brevity.

In addition, in the present embodiments, the control circuit 160 may further be configured to determine whether abnormal conditions occurred at the detecting points DP1, DP2, DP3-DPn according to which one of the voltage signals Vt1, Vt2-Vtm varies, and output the corresponding over temperature warning signal. For example, if the control circuit 160 receives that the voltage signal Vt1 exceeds the threshold value, it is determined that over temperature occurred at one or more detecting points (e.g., the detecting points DP1, DP2) corresponding to the sensing element TC1, and the control circuit 160 may output the specific warning signal accordingly.

Thus, the user may determine the connecting wires and lock attachment elements at which nodes are not tightly connected, and save the time required to clear the fault. In addition, the sensing circuit 140 in the present embodiments may also be applied in the electronic device 100 of which the detecting points to be detected are at diverse locations and difficult to perform detection with the same electricity circuit.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure.

For example, in some embodiments, the sensing circuit 140 may respectively output multiple voltage signal Vt1, Vt2-Vtm, and the voltage signal Vt1, Vt2-Vtm correspond to multiple sensing elements TC1, TC2-TCm respectively.

Figure 5:
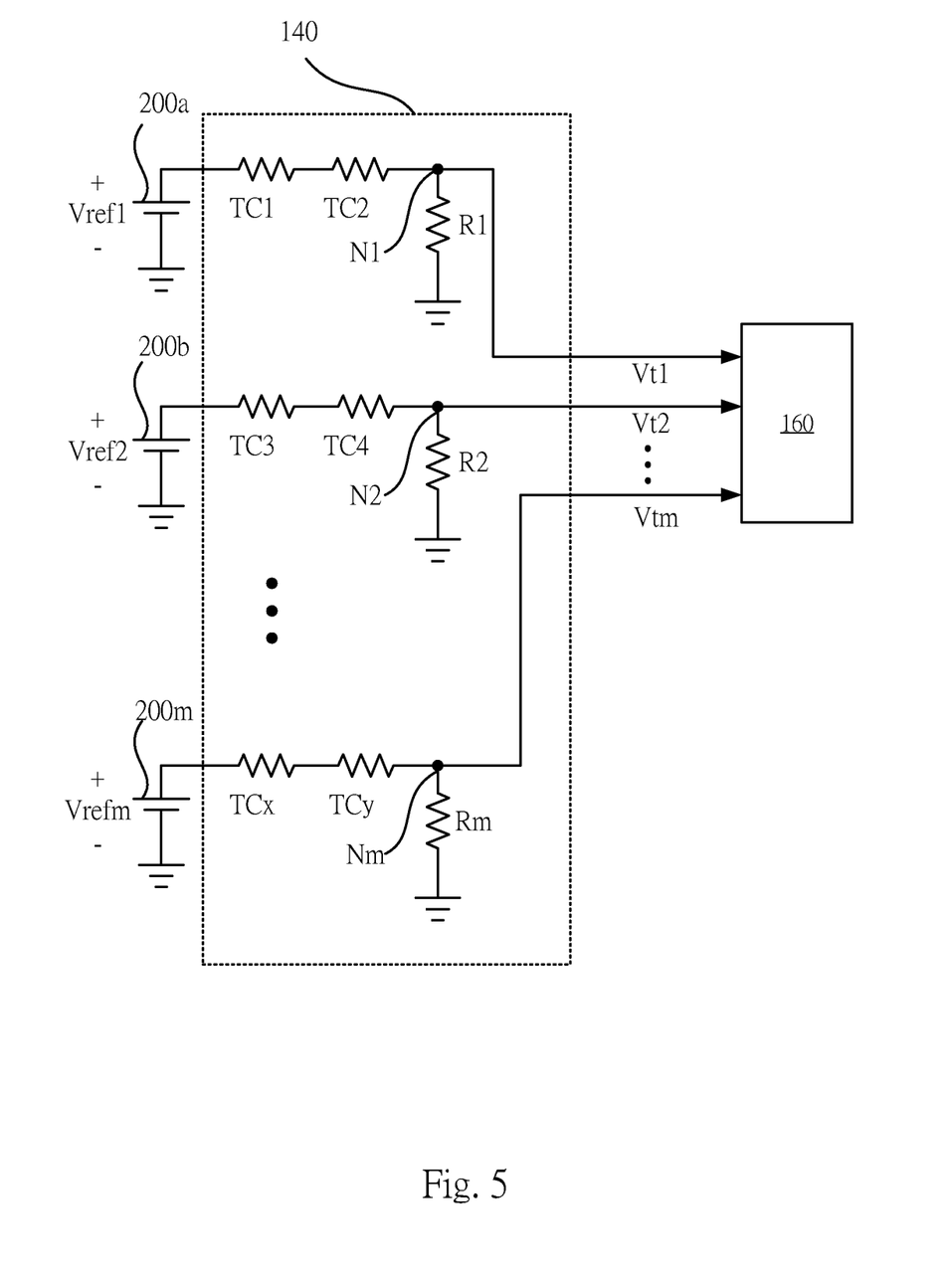
FIG. 5 is a circuit diagram illustrating the sensing circuit according to some other embodiments of the present disclosure.

Reference is made to FIG. 5. FIG. 5 is a circuit diagram illustrating the sensing circuit 140 according to some other embodiments of the present disclosure. Similarly, the sensing circuit 140 illustrated in FIG. 5 may be applied in the electronic device 100 of the embodiments of FIG. 1A, FIG. 2A, or FIG. 3A.

Compared to the sensing circuit 140 illustrated in FIG. 4, in the sensing circuit 140 illustrated in FIG. 5, each of the voltage signals Vt1, Vt2-Vtm corresponds to two or more sensing elements TC1, TC2-TCm respectively.

Specifically, the sensing elements TC1, TC2 are coupled to each other in series and configured to receive the reference voltage Vref1 from the voltage source 200a, and perform the voltage division with the voltage dividing resistor R1 to output the voltage signal Vt1 via the node N1.

The sensing elements TC3, TC4 are coupled to each other in series and configured to receive the reference voltage Vref2 from the voltage source 200b, and perform the voltage division with the voltage dividing resistor R2 to output the voltage signal Vt2 via the node N2, and so on. The sensing elements TCx, TCy are coupled to each other in series and configured to receive the reference voltage Vrefm from the voltage source 200m, and perform the voltage division with the voltage dividing resistor Rm to output the voltage signal Vtm via the node Nm.

Alternatively stated, in various electronic devices 100, since the sensing circuit 140 is arranged at the back surface of the printed circuit board 120, the flexibility of the arrangement is high, and thus the number of the sensing elements, the voltage dividing resistors, and output voltage signals may be determined according to the sensitivity and accuracy of the temperature detection, the cost consideration, and the distribution location of the detecting points in various electronic devices, in order to apply corresponding circuit structure to achieve the sensing circuit 140.

Figure 6:
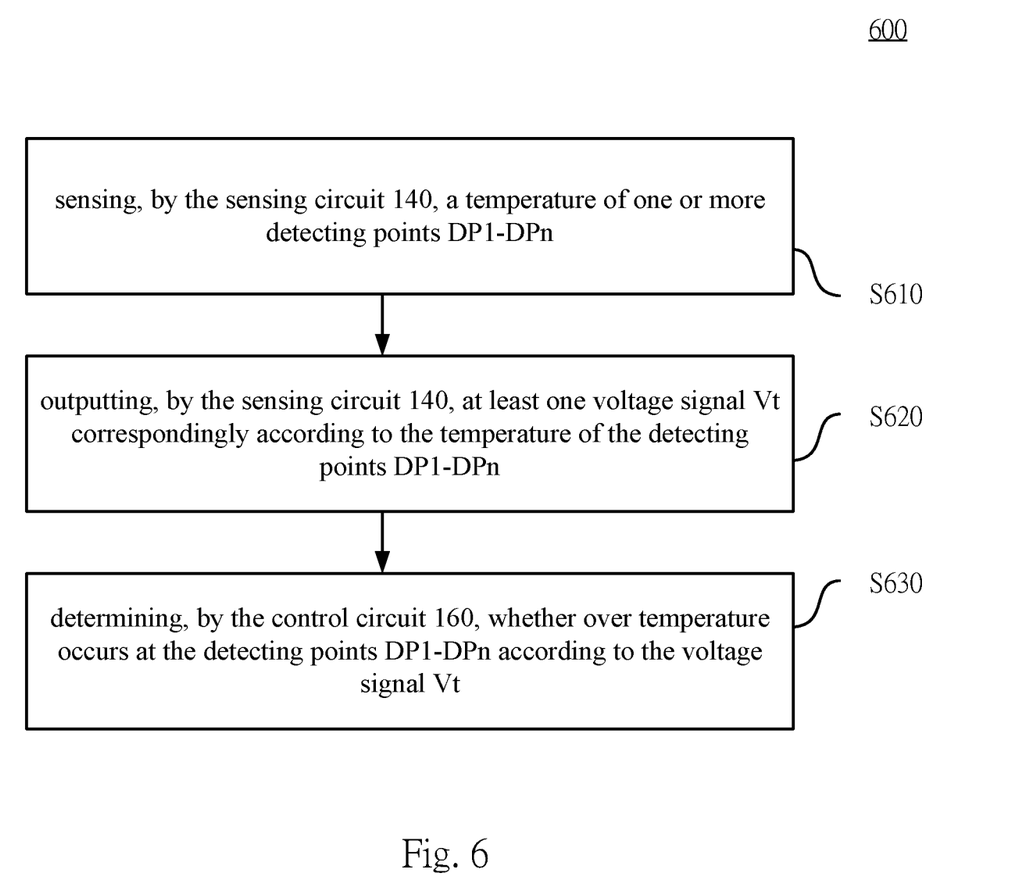
FIG. 6 is a flow chart of an over temperature detecting method in accordance with some embodiments of the present disclosure.

Reference is made to FIG. 6. FIG. 6 is a flow chart of an over temperature detecting method 600 in accordance with some embodiments of the present disclosure. For better understanding of the present disclosure, the over temperature detecting method 600 is discussed in relation to the embodiments shown in FIG. 1A to FIG. 5, but is not limited thereto. It will be apparent to those skilled in the art that various modifications and variations can be made without departing from the scope or spirit of the disclosure. As shown in FIG. 6, the over temperature detecting method 600 includes steps S610, S620, and S630.

First, in step S610, the electronic device 100 is configured to sense, by the sensing circuit 140, a temperature of one or more detecting points DP1-DPn.

In some embodiments, the step S610 further includes detecting, by M sensing elements TC1, TC2-TCm in the sensing circuit 140, N detecting points DP1-DPn arranged at the first surface of the printed circuit board 120, in which M is an integer and N is an integer larger than M.

Next, in step S620, the electronic device 100 is configured to output, by the sensing circuit 140, at least one voltage signal Vt correspondingly according to the temperature of the detecting points DP1-DPn.

In some embodiments, the operation of outputting at least one voltage signal Vt includes receiving, by the sensing circuit 140, the reference voltage Vref from the voltage source 200, and dividing, by one or more sensing elements TC1-TCm and the voltage dividing resistor R1 in the sensing circuit 140, the reference voltage Vref to output the voltage signal Vt In some other embodiments, the operation of outputting multiple voltage signals Vt1-Vtm in step S620 includes receiving, by multiple sensing elements TC1-TCm in the sensing circuit 140, multiple reference voltages Vref1-Vrefm from multiple corresponding voltage sources 200a-200m, and dividing, by the sensing elements TC1-TCm and multiple corresponding voltage dividing resistors R1-Rm, the reference voltages Vref1-Vrefm to output multiple corresponding voltage signals Vt1-Vtm to the control circuit 160.

Next, in step S630, the electronic device 100 is configured to determine, by the control circuit 160, whether over temperature occurs at the detecting points DP1-DPn according to the voltage signal Vt.

In some embodiments, in step S630, the electronic device 100 is configured to determine, by the control circuit 160, over temperature occurs at the detecting points DP1-DPn and output the over temperature warning signal on the condition that the voltage signal Vt is greater than the threshold value.

Those skilled in the art can immediately understand how to perform the operations and functions of the over temperature detecting method 600 based on the electronic device 100 in the embodiments described above, and thus a further explanation is omitted herein for the sake of brevity.

The above description includes exemplary operations, but the operations are not necessarily performed in the order described. The order of the operations disclosed in the present disclosure may be changed, or the operations may even be executed simultaneously or partially simultaneously as appropriate, in accordance with the spirit and scope of various embodiments of the present disclosure.

In summary, in various embodiments of the present disclosure, the sensing elements are arranged in a different side from which the detecting point located in the printed circuit board, and perform temperature detection to the detecting points via the metal layer in the printed circuit board for heat transmission. Compared to the arrangement of locating at the same side of the printed circuit board, the temperature variation of the detecting points may be more precisely detected, and thus on the condition that the connecting wires and the lock attachment elements are not tightly connected, the resulted abnormal high temperature may be soon discovered and the abnormal condition may be reported quickly, which avoids the heat damaging the machine and the fire hazard.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device comprising:
   a printed circuit board;
   a control circuit configured to determine whether over temperature occurs at one or more detecting points arranged at a first surface of the printed circuit board according to at least one voltage signal; and
   a sensing circuit arranged at a second surface opposite to the first surface of the printed circuit board, and configured to sense a temperature on the first surface at the one or more detecting points and correspondingly output the voltage signal to the control circuit, wherein the sensing circuit comprises:
   a voltage dividing resistor; and
   one or more sensing elements electrically coupled to the voltage dividing resistor in series, wherein the sensing circuit is electrically coupled to a voltage source to receive a reference voltage and divide the reference voltage to output the at least one voltage signal by the one or more sensing elements and the voltage dividing resistor.

2. The electronic device of claim 1, wherein the sensing circuit comprises M sensing elements configured to detect N detecting points arranged at the first surface of the printed circuit board, wherein M is an integer and N is an integer larger than M.

3. The electronic device of claim 2, wherein each of the one or more sensing elements is configured to detect two or more detecting points.

4. The electronic device of claim 1, wherein the one or more sensing elements are configured to sense the temperature of the one or more detecting points arranged at the first surface of the printed circuit board by heat transfer via a metal material internal to the printed circuit board.

5. The electronic device of claim 1, wherein resistance of the one or more sensing elements varies as the sensed temperature varies.

6. The electronic device of claim 1, wherein the control circuit is configured to determine over temperature occurs at the one or more detecting points and output an over temperature warning signal, on the condition that the at least one voltage signal is greater than a threshold value.

7. An electronic device comprising:
   a printed circuit board;
   a control circuit configured to determine whether over temperature occurs at one or more detecting points arranged at a first surface of the printed circuit board according to at least one voltage signal; and
   a sensing circuit arranged at a second surface opposite to the first surface of the printed circuit board, and configured to sense a temperature on the first surface at the one or more detecting points and correspondingly output the voltage signal to the control circuit, wherein the sensing circuit comprises:
   a plurality of voltage dividing resistors; and
   a plurality of sensing elements electrically coupled to a plurality of voltage sources respectively to receive a plurality of reference voltages respectively, and electrically coupled to the corresponding voltage dividing resistors, in order to divide the reference voltages to output a plurality of corresponding voltage signals to the control circuit.

8. The electronic device of claim 7, wherein the sensing circuit comprises M sensing elements configured to detect N detecting points arranged at the first surface of the printed circuit board, wherein M is an integer and N is an integer larger than M.

9. The electronic device of claim 8, wherein each of the one or more sensing elements is configured to detect two or more detecting points.

* * * * *